US007467587B2

United States Patent
(12)

Vermeersch et al.

(10) Patent No.: US 7,467,587 B2

(45) Date of Patent: Dec. 23, 2008

(54) METHOD FOR ACCURATE EXPOSURE OF SMALL DOTS ON A HEAT-SENSITIVE POSITIVE-WORKING LITHOGRAPHIC PRINTING PLATE MATERIAL

(75) Inventors: Joan Vermeersch, Deinze (BE); Wim Sap, Bruges (BE); Marc Van Damme, Bonheiden (BE)

(73) Assignee: Agfa Graphics, N.V., Mortsel (BE)

( * ) Notice: Subject to any disclaimer, the term of this patent is extended or adjusted under 35 U.S.C. 154(b) by 0 days.

(21) Appl. No.: 11/114,210

(22) Filed: Apr. 21, 2005

(65) Prior Publication Data

US 2005/0235854 A1 Oct. 27, 2005

Related U.S. Application Data

(60) Provisional application No. 60/567,691, filed on May 3, 2004.

(30) Foreign Application Priority Data

Apr. 21, 2004 (EP) .................................. 04101647

(51) Int. Cl.
*B41C 1/10* (2006.01)
*B41M 1/06* (2006.01)
*G03F 7/00* (2006.01)

(52) U.S. Cl. .................... 101/467; 101/463.1; 101/453; 101/451; 430/270.1

(58) Field of Classification Search ................. 101/467; 430/270.1

See application file for complete search history.

(56) References Cited

U.S. PATENT DOCUMENTS

| | | | |
|---|---|---|---|
| 4,045,232 | A | 8/1977 | Parkinson |
| 4,458,005 | A | 7/1984 | Mohr et al. |
| 4,840,713 | A | 6/1989 | Pliefke |
| 4,897,168 | A | 1/1990 | Boergerding et al. |

(Continued)

FOREIGN PATENT DOCUMENTS

| | | |
|---|---|---|
| DE | 40 01 466 A1 | 7/1991 |

(Continued)

*Primary Examiner*—Leslie J. Evanisko
*Assistant Examiner*—Joshua D. Zimmerman
(74) *Attorney, Agent, or Firm*—Leydig, Voit & Mayer, Ltd.

(57) ABSTRACT

A method is disclosed for accurate reproduction of high-quality halftone images comprising microdots by means of lithographic plate materials which comprise a heat-sensitive positive-working coating that requires wet processing. Such microdots have a dot size ≦25 μm and may be obtained by stochastic screening or by amplitude-modulated screening at a ruling of not less than 150 lpi. It has been established that the "physical right exposure energy density" (physical REED) lies in the range from CP to 1.5*CP, wherein the physical REED is defined as the energy density at which the physical area on the plate, occupied by a microdot corresponding to a 50% halftone in the image data, coincides with the 50% target value; and wherein CP is the clearing point of the plate which is defined as the minimum energy density that is required to obtain, after processing, a dissolution of 95% of the coating. An accurate reproduction of microdots can therefore be achieved by exposing the material with light having an energy density in the range from CP to 1.5*CP. Loss of microdots by overexposure is thereby avoided.

19 Claims, 6 Drawing Sheets

U.S. PATENT DOCUMENTS

| | | | | |
|---|---|---|---|---|
| 4,981,517 | A | 1/1991 | DeSanto, Jr. et al. | |
| 5,156,723 | A | 10/1992 | Pliefke et al. | |
| 5,163,368 | A | 11/1992 | Pensavecchia et al. | |
| 5,174,205 | A | 12/1992 | Kline et al. | |
| 5,229,253 | A | 7/1993 | Zertani et al. | |
| 5,314,787 | A | 5/1994 | Elsaesser et al. | |
| 5,637,441 | A | 6/1997 | Brenk et al. | |
| 5,641,608 | A | 6/1997 | Grunwald et al. | |
| 5,695,903 | A | 12/1997 | Elsaesser et al. | |
| 6,121,996 | A | 9/2000 | Gelbart | |
| 6,140,392 | A | 10/2000 | Kingman et al. | |
| 6,190,825 | B1 | 2/2001 | Denzinger et al. | |
| 2003/0003406 | A1 | 1/2003 | Grunwald et al. | |
| 2005/0003296 | A1 * | 1/2005 | Memetea et al. ......... | 430/270.1 |
| 2005/0136356 | A1 * | 6/2005 | Van Damme et al. .... | 430/270.1 |

FOREIGN PATENT DOCUMENTS

| | | | |
|---|---|---|---|
| DE | 44 17 907 | A1 | 11/1995 |
| DE | 44 23 140 | A1 | 1/1996 |
| EP | 0 291 760 | | 11/1988 |
| EP | 0 292 801 | | 11/1988 |
| EP | 0 400 706 | A1 | 12/1990 |
| EP | 0 537 633 | A1 | 4/1993 |
| EP | 0 556 690 | A1 | 8/1993 |
| EP | 0 625 728 | A2 | 11/1994 |
| EP | 0 659 909 | A1 | 6/1995 |
| EP | 0 734 147 | A1 | 9/1996 |
| EP | 0 823 327 | A2 | 2/1998 |
| EP | 0 864 420 | A1 | 9/1998 |
| EP | 0 881 096 | A1 | 12/1998 |
| EP | 0 894 622 | A2 | 2/1999 |
| EP | 0 901 902 | A2 | 3/1999 |
| EP | 0 933 682 | A2 | 8/1999 |
| EP | 0 934 822 | | 8/1999 |
| EP | 0 950 517 | A1 | 10/1999 |
| EP | 0 978 376 | A2 | 2/2000 |
| EP | 0 982 123 | A2 | 3/2000 |
| EP | 1 029 667 | A1 | 8/2000 |
| EP | 1 053 868 | A2 | 11/2000 |
| EP | 1 072 432 | A2 | 1/2001 |
| EP | 1 074 386 | A2 | 2/2001 |
| EP | 1 074 889 | A2 | 2/2001 |
| EP | 1 093 934 | A1 | 4/2001 |
| EP | 1 295 717 | A2 | 3/2003 |
| EP | 1 380 417 | A1 | 1/2004 |
| GB | 1084070 | | 9/1967 |
| JP | 20-96755 | | 4/1990 |
| JP | 60-88942 | | 3/1994 |
| WO | WO 97/39894 | A1 | 10/1997 |
| WO | WO 99/01795 | A2 | 1/1999 |
| WO | WO 99/21725 | A1 | 5/1999 |
| WO | WO 00/29214 | A1 | 5/2000 |
| WO | WO 01/45958 | A2 | 6/2001 |

* cited by examiner

4x4

2x2

1x1

1x1 (1700x)

6x6 (450x)

METHOD FOR ACCURATE EXPOSURE OF SMALL DOTS ON A HEAT-SENSITIVE POSITIVE-WORKING LITHOGRAPHIC PRINTING PLATE MATERIAL

CROSS-REFERENCE TO RELATED PATENT APPLICATIONS

This patent application claims the benefit of U.S. Provisional Patent Application No. 60/567,691, filed May 3, 2004, which is incorporated by reference. In addition, this application claims the benefit of European Application No. 04101647.8 filed Apr. 21, 2004, which is also incorporated by reference.

FIELD OF THE INVENTION

The present invention relates to a direct-to-plate exposure method for making lithographic printing plates from a heat-sensitive positive-working precursor, more particularly to a method that enables the accurate exposure of small dots as required in stochastic screens and in amplitude-modulated screens having high rulings.

BACKGROUND OF THE INVENTION

Lithographic printing typically involves the use of a so-called printing master such as a printing plate which is mounted on a cylinder of a rotary printing press. The master carries a lithographic image on its surface and a print is obtained by applying ink to said image and then transferring the ink from the master onto a receiver material, which is typically paper. In conventional lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called driographic printing, the lithographic image consists of ink-accepting and ink-abhesive (ink-repelling) areas and during driographic printing, only ink is supplied to the master.

Printing masters are generally obtained by the image-wise exposure and processing of an imaging material called plate precursor. A typical positive-working plate precursor comprises a hydrophilic support and an oleophilic coating which is not readily soluble in an aqueous alkaline developer in the non-exposed state and becomes soluble in the developer after exposure to radiation. In addition to the well known photosensitive imaging materials which are suitable for UV contact exposure through a film mask (the so-called pre-sensitized plates), also heat-sensitive printing plate precursors have become very popular. Such thermal materials offer the advantage of daylight stability and are especially used in the so-called computer-to-plate method (CtP) wherein the plate precursor is directly exposed, i.e. without the use of a film mask. The material is exposed to heat or to infrared light and the generated heat triggers a (physico-)chemical process, such as ablation, polymerization, insolubilization by cross-linking of a polymer or by particle coagulation of a thermoplastic polymer latex, and solubilization by the destruction of intermolecular interactions or by increasing the penetrability of a development barrier layer. Although some of these thermal processes enable plate making without wet processing, the most popular thermal plates form an image by a heat-induced solubility difference in an alkaline developer between exposed and non-exposed areas of the coating. The coating typically comprises an oleophilic binder, e.g. a phenolic resin, of which the rate of dissolution in the developer is either reduced (negative working) or increased (positive working) by the image-wise exposure. During processing, the solubility differential leads to the removal of the non-image (non-printing) areas of the coating, thereby revealing the hydrophilic support, while the image (printing) areas of the coating remain on the support. Typical examples of positive-working thermal plate materials are described in e.g. EP-A 625728, 823327, 825927, 864420, 894622 and 901902.

SUMMARY OF THE INVENTION

A problem associated with positive-working thermal plate materials which require wet processing, is the insufficient capability of reproducing small printing dots such as the microdots produced by stochastic screening methods or the small halftone dots in conventional amplitude-modulated screens at high rulings, e.g. a 1% dot at a screen ruling of 150 lines per inch (about 60 lines per cm). In each of these screening methods, the quality of at least part of the image relies on the accurate reproduction of small dots. Such print jobs require extremely tight control of the entire plate-making and printing process taking into account phenomena such as dot gain on the printing press. Even then, it remains difficult to use positive-working thermal plates for this work because it is observed that dots having a size of ≦25 μm are often lost during the plate-making process (exposure and processing). With such high-resolution screens, the loss of the 25 μm dot means the loss of a considerable portion of the image (even the complete image in a first-order stochastic screen).

It is therefore an aspect of the present invention to provide a method that enables an accurate reproduction of small dots by means of positive-working thermal plate materials. This object is realized by the method of claim 1. Preferred embodiments are defined in the dependent claims. Further advantages and embodiments of the present invention will become apparent from the following description [and drawings].

DETAILED DESCRIPTION OF THE INVENTION

Figure 1:
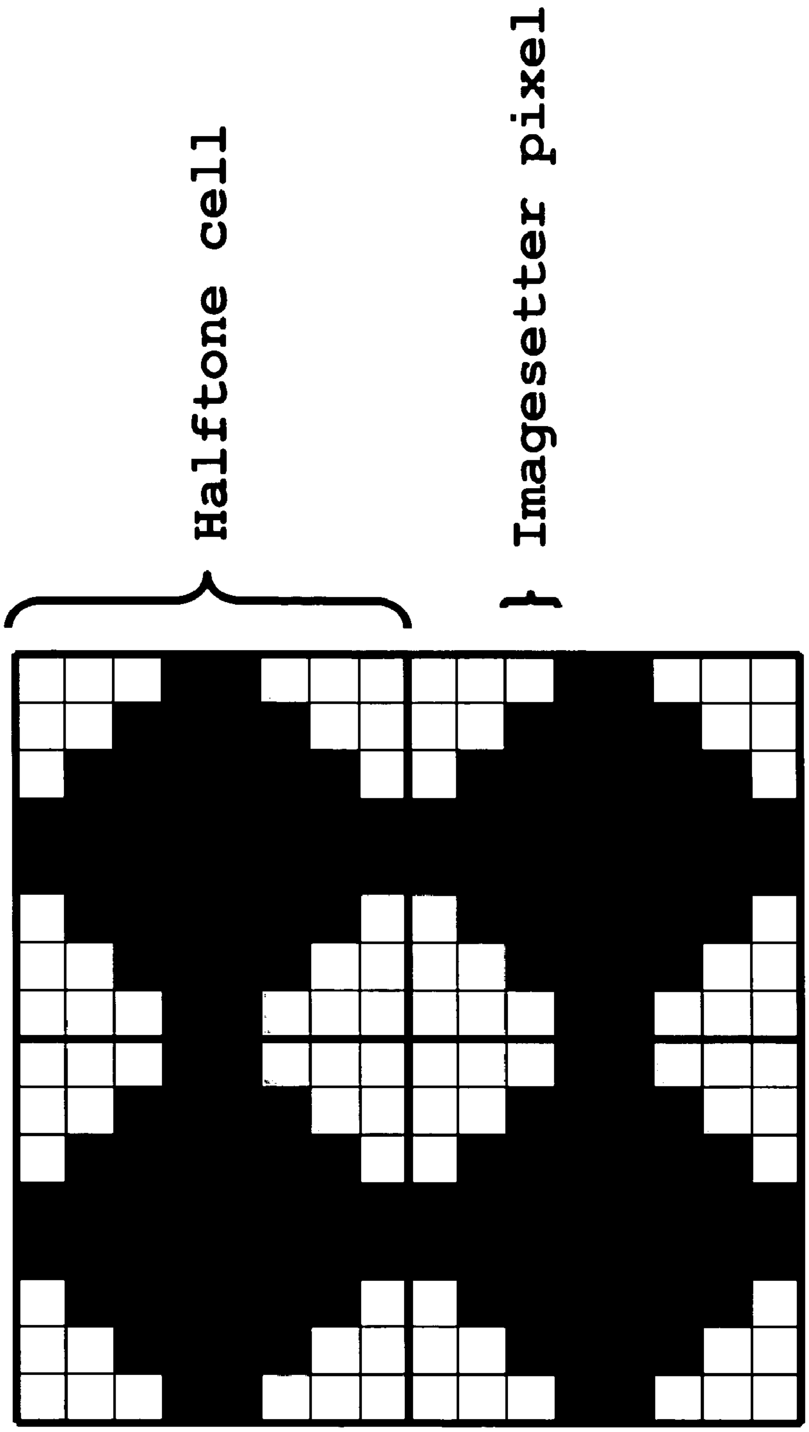
FIG. 1 is a schematic representation of four halftone image cells, each consisting of 8×8 image-recorder pixels.

Due to the binary nature of the lithographic printing process, wherein ink is either accepted by the plate or not, continuous color densities have to be reproduced by the halftone screening process which involves breaking the image into a series of dots. In the conventional amplitude modulation (AM) screening, the original image is simulated by dots of varying sizes at regular, fixed positions which are often represented as halftone cells in a grid (FIG. 1). Conventionally, a so-called 100% black dot is generated when the complete area of the halftone cell is ink-accepting. A 0% dot corresponds to a halftone cell which is completely water-accepting. The halftone dots in FIG. 1 occupy 40/64=62.5% of the area.

AM screens are further characterized by their line frequency, also called screen ruling, which equals the number of lines of dots per unit of distance, universally expressed as lines per inch (lpi). The higher the screen ruling, the smaller the dimensions of the halftone cells. The high quality AM images used in the method of the present invention require a screen ruling of not less than 150 lpi (about 60 lines/cm), more preferably not less than 200 lpi (about 80 lines/cm). At 150 lpi, a 1% dot corresponds to a printing area that occupies 1% of the halftone cell, i.e. a dot having a diameter of about 20 μm.

In the CtP method, halftone images are generally exposed on a thermal plate material by means of infrared light in a digital imagesetter. Typically, the imagesetter has an output resolution, universally expressed in terms of imaging spots or pixels per inch (ppi), that is much higher than the screen ruling. A so-called raster image processor (RIP) translates the halftone image information into image recording information, which may be visualized by overlaying the halftone cells of the halftone image grid over the image-recording spots of the imagesetter resolution grid (FIG. 1). In the simplified FIG. 1, the number of pixels per halftone cell is 64 (8×8), but in practice that number is much higher. For example, if the imagesetter resolution is 2400 ppi (about 950 pixels/cm) and the screen ruling is 100 lpi (about 40 lines/cm), there are 576 (24×24) imagesetter pixels in each halftone cell ($(2400/100)^2=576$).

In addition to AM screening, the stochastic screening technique, often also referred to as frequency-modulated (FM) screening, has received much attention in the 1990s. Instead of using regularly spaced dots of different size to create tones, so-called first-order FM screens consist of variably spaced dots of a small, fixed size, called microdots. A typical FM screened image consists of microdots having a size of 25 μm or less. The minimum size of the microdots is limited only by the output resolution of the imagesetter. Although FM microdots can be as small as a single imagesetter pixel, singe-pixel dots may actually be too small to be practical, so often FM microdots are built from cells of 1×1, 2×2 or 3×3 imagesetter pixels. For instance, a microdot size of 20 μm may be used—about as large as a 1% dot in a 150 lpi AM screen—which can be exposed on the plate by means of four (2×2) pixels of 10 μm each. Since the microdots are dispersed across the screen by varying their frequency in accordance with the image tone value, concepts such as screen ruling do not apply in FM screening.

The known advantages of FM screening vs. AM screening are the absence of Moiré, easier registration, higher quality at low resolution, higher detail rendition and smooth tone rendering. On the other hand FM screening may cause problems such as a 'flat' appearance of light skin tones and wood tones or excessively grainy highlights (≦10% tones). Therefore, variants have been developed such as second-order stochastic screening which combines the concept of variable dot size with variable spacing. Another variant is hybrid screening, wherein stochastic dot patterns are used for some portions of the image and conventional AM halftoning for other portions.

Although the above description of the various screening methods is part of the common general knowledge, it has been included for the sake of providing the proper definitions.

In the positive-working plate-making method, the areas of the coating of the plate precursor that correspond to the non-printing areas are exposed and washed away in a developer. The temperature that is induced in the coating during heat-mode exposure, e.g. using an infrared laser, is dependent on the energy density (expressed in Joules per area, e.g. $mJ/cm^2$) of the laser beam at the surface of the plate. Thermal plates are characterized by a threshold temperature above which the imaging mechanism of the coating is triggered.

Figure 2:
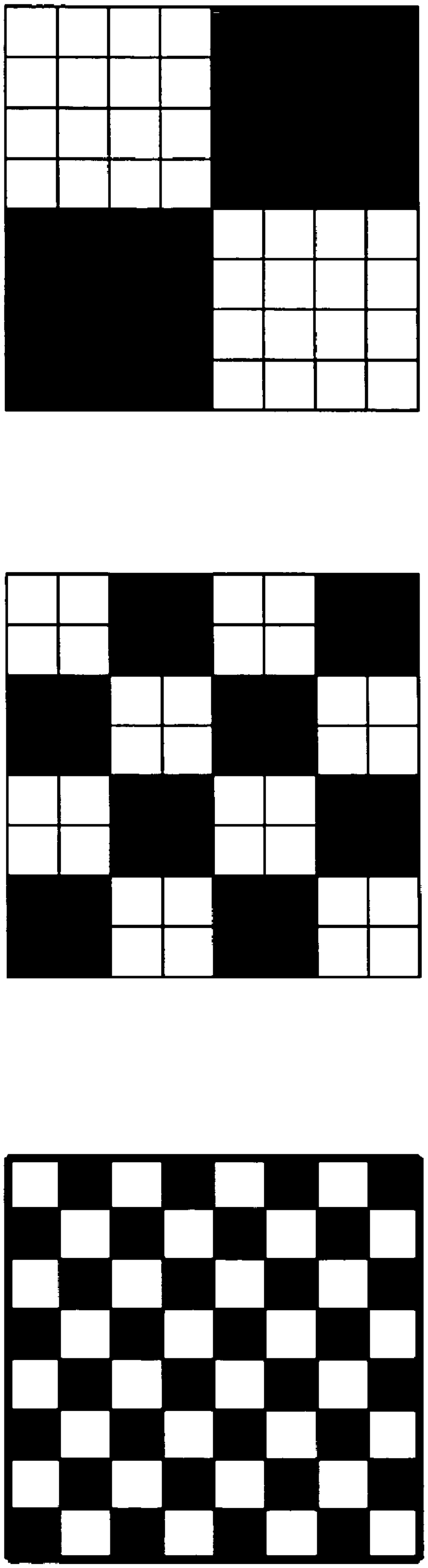
FIG. 2 is a schematic representation of three 50% n×n checkerboard patterns, wherein n=1, 2 and 4.

A commercially available method for determining a suitable energy density for the practical exposure of a thermal plate relies on checkerboard matching and will be explained hereafter. According to one conventional method, a 50% halftone image is exposed on the plate using various checkerboard patterns wherein the edges of the dots just touch each other, as shown in FIG. 2. The images in this figure (as well as FIG. 1) correspond to a so-called square spot, but the same principles can be used for other spot forms such as circular or elliptical spots. Any reference to 'dot size' and 'spot size' shall be understood as a reference to the diameter in case of a circular dot/spot, the long axis of an elliptical or rectangular dot/spot and the edge of a square dot/spot. A square spot may be generated on the plate by sweeping a narrow rectangular laser spot in the direction transverse to the long axis of the rectangular spot as described in U.S. Pat. No. 6,121,996. In the embodiment of FIG. 2, the small dots of the 1×1 checkerboard correspond to a single square spot of the imagesetter. A 2×2 checkerboard consists of dots which have twice the size of the spot, etc. Conventionally the area portion occupied by the halftone dots obtained on the plate after exposure and development, referred to hereafter as 'dot area', is determined by reflection densitometry using the known Murray-Davies equation:

$$\text{dot area }(\%)=(1-10^{-D_e})/(1-10^{-D_u})*100$$

wherein $D_u$=optical density of the unexposed plate; and $D_e$=optical density of the plate exposed with the halfdot image.

Figure 3:
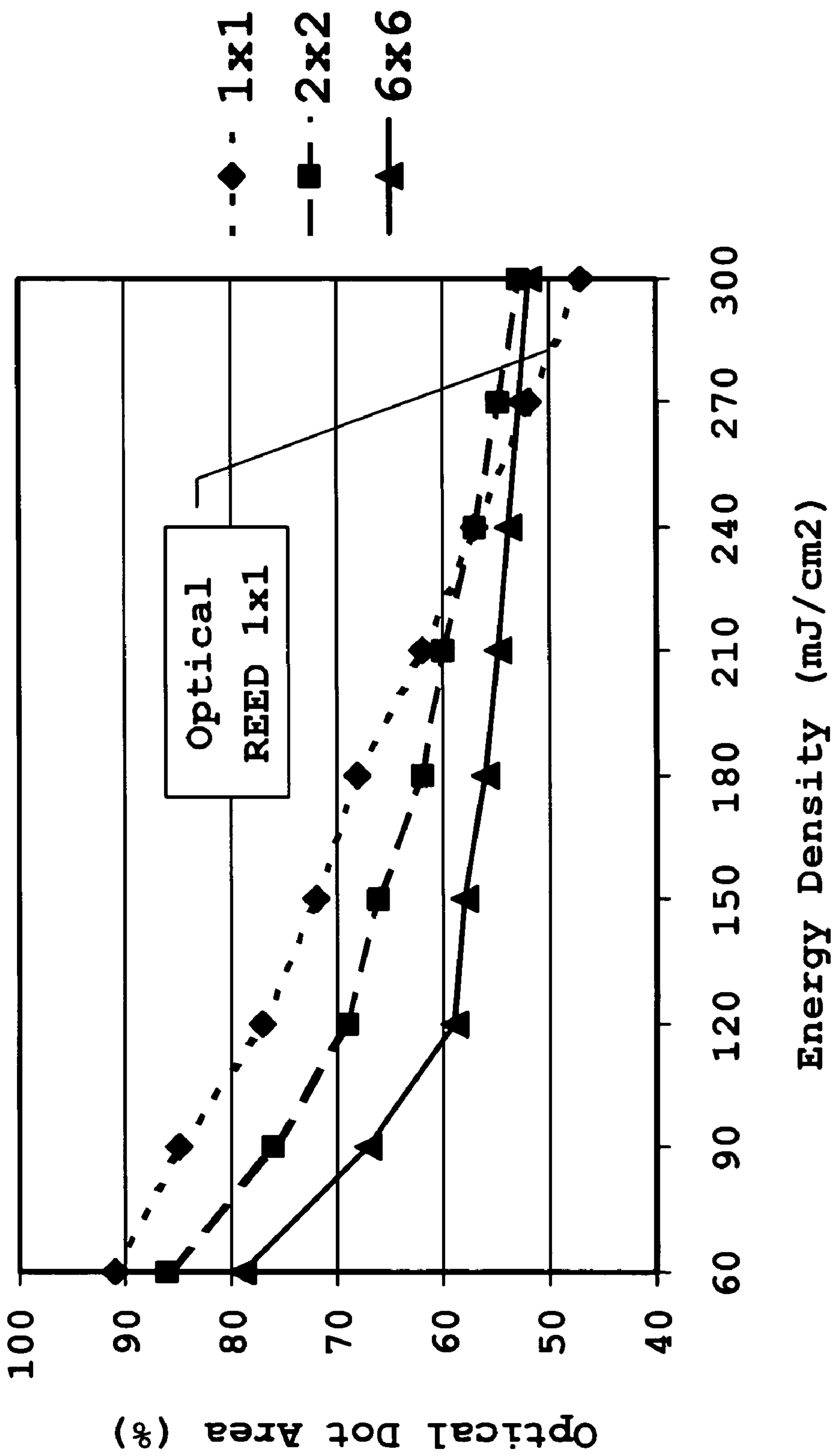
FIG. 3 shows the relationship between the optical dot area, obtained by reflection densitometry, of 50% checkerboard patters (1×1=10 μm dot; 2×2=20 μm dot and 6×6=60 μm dot) and the energy density used for the exposure of these patterns; these data were obtained from the plate/platesetter/developer system identified as Example 6.

Ideally, the dot area obtained on the plate after exposure of such 50% checkerboard patterns as shown in FIG. 2 and development should be 50%, irrespective of the dot size. However, it is observed in practice that fine 50% halfdot image data result in a dot area on the plate which deviates significantly from the 50% target value. FIG. 3 shows the actual dot area, measured by means of a reflection densitometer and calculated according to the above formula, obtained on a plate exposed with a 50% checkerboard pattern at various energy density values and then processed according to the conditions (time, temperature, developer) used. FIG. 3 shows that when these 50% checkerboard patterns are exposed at low energy densities, the dot area on the plate is larger than the target value of 50%: it is believed that, due to the underexposure, the coating just around the edge of the dot does not dissolve sufficiently rapidly in the developer. At too high energy density values, the overexposure of the coating around the dot leads to dissolution of the edges of the dot, resulting in a dot area value that is lower than 50%.

The curve shown in FIG. 3 can be used for determining the energy density value for the practical exposure of a positive-working thermal plate. From these curves, it can be established by interpolation at which energy density the obtained dot area coincides with the target value (50%): that value is referred to herein as the 'right exposure energy density' (REED). In other words, the REED value is defined as the minimum energy density at which the dot area on the plate, occupied by an image corresponding to a 50% halftone in the image data, coincides with the 50% target value. It is clear to the skilled person that a lower REED value indicates a higher sensitivity of the plate. As an illustration, FIG. 3 shows that the REED value for the 1×1 checkerboard (10 μm dots), obtained by the above described method, is about 285 $mJ/cm^2$.

The present inventors have now established that the thus obtained REED value only produces good prints for AM screens at medium to low frequency (i.e. wherein 1% dots have a size >25 μm). It is observed that the REED value thus obtained is not suitable for the high-quality screens which are used in the method of the present invention, i.e. images comprising microdots having a size ≦25 μm: positive-working thermal plates which are exposed at the REED, obtained by the above method, produce prints wherein these small dots are partially or completely lost. The inventors believe that the REED value, which is obtained with conventional methods such as reflectance densitometry explained above, is too high and results in an overexposure of the non-printing area that surrounds the microdot. As a consequence of this overexposure, the actual i.e. physical size of the resulting microdot is smaller than intended although the reflection density measurements suggest that exposure at the REED produces a dot size on the plate that is equal to the image dot size in the RIP. In practice, the error is noticed on the printed copies because the final ink dot on the printed copy is the result of the physical dot on the plate (in this discussion, the so-called 'mechanical dot gain' on the press due to ink spreading in the paper is ignored, since this phenomenon is routinely compensated by the software of the imagesetter).

The reason for the above described discrepancy between optical dot size and the true physical dot size is related to the densitometers which are typically used in these commercially available methods: the reflection density of the plate is measured by means of a densitometer of which the spot size is much larger than the true size of the dots present in the checkerboard image. Due to light scattering and halo-effects at the edge of the microdots, such measurements produce optical dot area values that are higher than the true physical dot area which can be determined by e.g. scanning electron microscopy (SEM, see e.g. FIG. 6) or microdensitometry (further explained in the Examples section). This 'optical dot gain' phenomenon is more significant at small dot sizes, because it is an edge effect: a fine pattern such as a 10 μm checkerboard has more edges than a coarse pattern such as a 60 μm checkerboard. As a result, the REED value as obtained by the known methods using a conventional densitometer, which we will refer to as the 'optical REED', is indeed the 'right' exposure energy density for images consisting of relatively large dots such as 60 μm dots, but not for high-quality images comprising microdots having a dot size ≦25 μm. Due to the optical dot gain phenomenon described above, the loss of small image dots is incorrectly measured by the conventional methods and only detected when the printed copies appear to be too low in density.

A possible explanation therefore is that plates, which are exposed at the optical REED, reach a temperature in the coating which is substantially higher than the above mentioned threshold temperature. This of course ensures a complete clean-out, i.e. the (hydrophobic) coating is removed from the (hydrophilic) support to such an extent that no toning (ink-acceptance in the non-image areas) is observed on the printed copies. However, the overexposure also results in the complete or partial loss of small image dots: the microdots seem to be burnt away when exposed at too high an energy density. Indeed, SEM of the image on the plate shows that the physical dot area obtained by exposure with a fine 50% checkerboard image (e.g. the 10 μm dots in FIG. 6) is actually smaller than 50%, while the physical dot area of larger patterns (e.g. the 60 μm checkerboard in FIG. 6) is very close to 50%.

Figure 4:
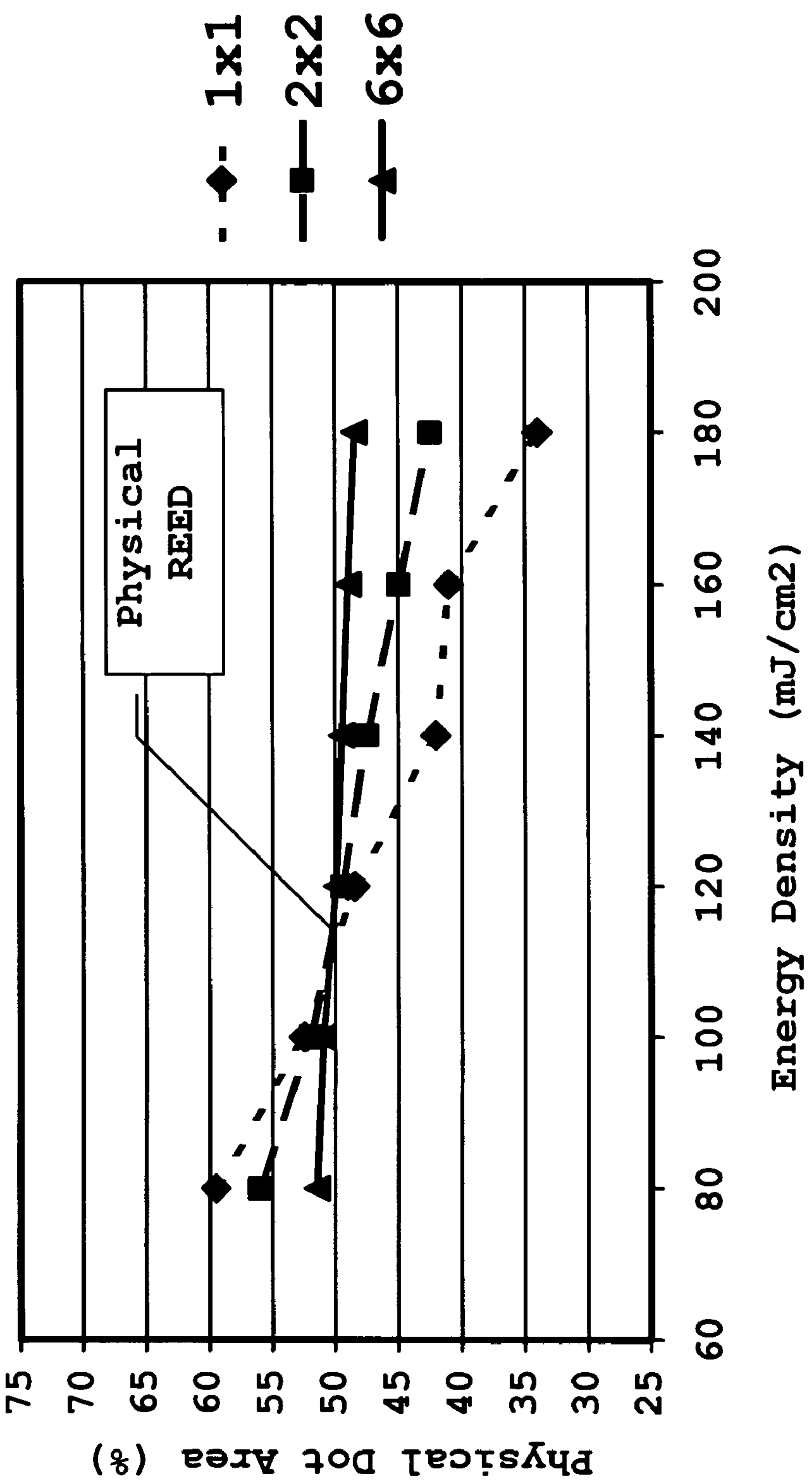
FIG. 4 shows the same relationship as in FIG. 3 with the proviso that the dot area is the physical dot area obtained by microdensitometry; these data were also obtained from the plate/platesetter/developer system identified as Example 6.

From the above it should be concluded that for an accurate reproduction of microdots on a positive-working thermal plate, one needs to employ an energy density which is lower than the optical REED value obtained by the conventional methods. We will refer to this lower REED value as the 'physical REED', which is defined as the energy density at which the physical area on the plate, occupied by a microdot corresponding to a 50% halftone in the image data, coincides with the 50% target value. The physical REED is obtained by means of measuring techniques that produce the true, physical dot area on the plate, such as SEM or microdensitometry, whereas the optical REED is obtained by means of conventional, 'macroscopic' densitometry, i.e. using a spot size which is much larger than the microdots themselves. As an illustration, FIG. 4 shows the physical dot area values obtained by microdensitometry vs. energy density for the same sample and 50% checkerboard patterns as in FIG. 3. It is clear that the physical REED, i.e. the energy density where the curves in FIG. 4 coincide with the 50% target value, is substantially lower than the optical REED obtained in FIG. 3 (about 115 $mJ/cm^2$ vs. 285 $mJ/cm^2$ for the 1×1 pattern).

Of course, SEM and microdensitometry are expert techniques which cannot be used by the end-user, e.g. in a print shop. The inventors have therefore developed a simple method which enables to determine an energy density value which is suitable for accurate exposure of high-quality screens on positive-working thermal plates. This novel method can be carried out by means of the widely available 'macroscopic' reflectance densitometers referred to above. Said novel method relies on the measurement of the so-called 'clearing point', as explained hereafter. According to this method, a solid wedge, i.e. areas consisting entirely of 0% dots (full exposure at all imagesetter pixels), is exposed on the plate material at various energy density values. The method is explained with reference to FIG. 5 wherein these energy density values form a series of discrete values resulting in a step-wedge, but it should be clear to the skilled reader that the energy density values may also vary continuously so as to obtain a continuous wedge. A preferred continuous wedge varies by not more than 10 $mJ/cm^2$ per cm wedge length. For the sake of simplicity, the solid step-wedge of FIG. 5 comprises only 7 steps, wherein each step is formed by 64 (8×8) imagesetter pixels. All pixels in each step are exposed at the same energy density (step 1: 60 $mJ/cm^2$; step 2: 80 $mJ/cm^2$; etc. upto step 7: 180 $mJ/cm^2$). It is clear to the skilled reader that in a practical embodiment, the steps are preferably much larger, having dimensions which are sufficiently large to enable density measurements of each step with macroscopic reflectance densitometers as in the conventional methods described above. A representation of such a practical embodiment however would not allow to show the many imagesetter pixels contained in each step. The wedge is preferably generated by the software that controls the imagesetter, although similar results can be obtained by other means, e.g. by placing a wedge filter in the light path of the imagesetter, preferably in contact with the plate. The minimum and maximum energy density for exposing the wedge should be adjusted to the particular type of plate that is being tested. A suitable interval may range from 30 to 300 $mJ/cm^2$. Also the number of steps in a preferred step-wedge is preferably higher than in FIG. 5 so as to allow a precise determination of the clearing point, which will now be explained.

Figure 5:
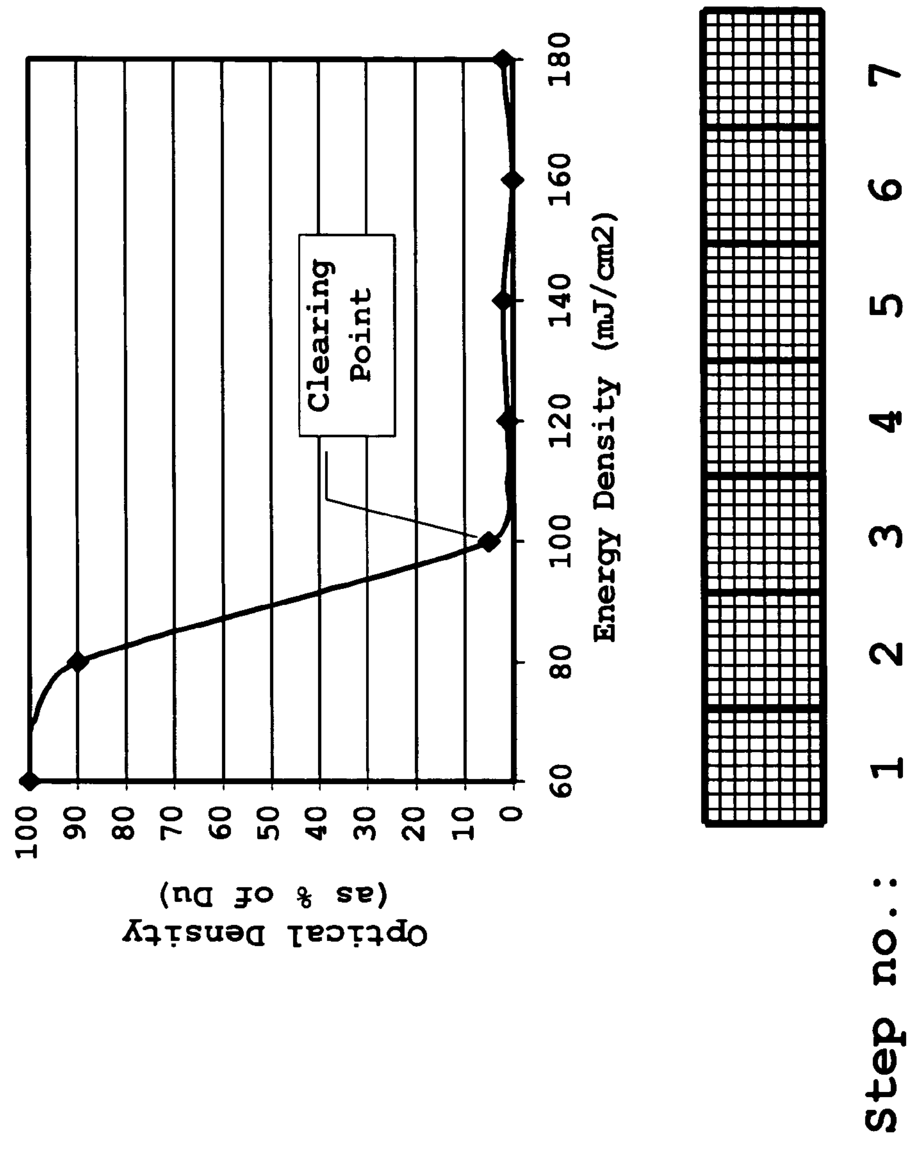
FIG. 5 The lower part is a schematic representation of a solid wedge consisting of 7 steps wherein each step comprises 64 (8×8) imagesetter pixels. The upper curve was obtained from the plate/platesetter/developer system identified as Example 6 and shows the relationship between the optical density of the coating after processing and the energy density used for exposing the steps of the wedge.

As already indicated before, exposure at an energy density which is insufficient to raise the temperature of the coating up to the threshold value (such as step 1 in FIG. 5) does not trigger the imaging mechanism and, after processing according to the conditions (time, temperature, developer) of the end-user, the coating normally remains on the support completely, i.e. the optical density of the coating essentially equals $D_u$, the optical density of the unexposed plate. At higher energy densities, the temperature in the coating approaches and eventually exceeds the threshold temperature and, as a result, the density of the coating that remains on the plate after processing decreases. The minimum energy density that is required to produce a reduction of the optical density of the exposed and processed plate coating by a factor of 95%, i.e. to produce an optical density of $0.05*D_u$, is defined herein as the 'clearing point'. In practice, CP can be determined with a step-wedge exposure by plotting the discrete values of optical density of the exposed and processed plate vs. the energy density as shown in FIG. 5 and establishing by interpolation at which energy is density the optical density of the coating is reduced by 95%.

The inventors have now established that the physical REED, defined above, lies in the range between the clearing point and the energy density equal to 1.5 times the clearing point. For example, the plate/platesetter/developer system of Example 6 below, of which data are represented in FIGS. 4 and 5, is characterized by a physical REED of about 115 $mJ/cm^2$ for the three nxn patterns, which is 15% higher than the clearing point (100 $mJ/cm^2$).

Figure 6:
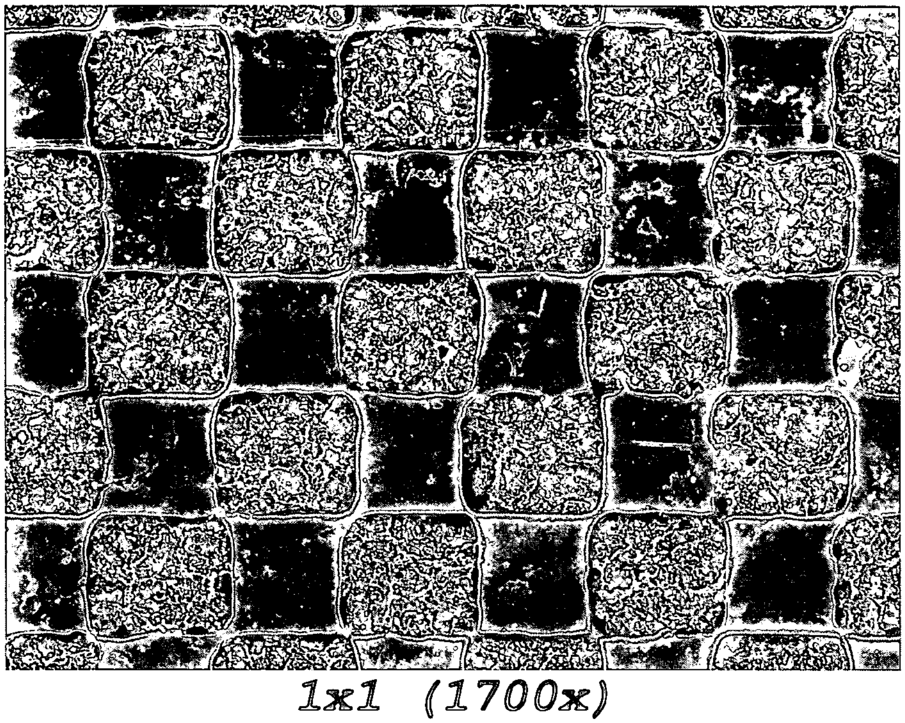
FIG. 6 SEM images of a 1×1 (10 μm dot) and a 6×6 (60 μm dot) 50% checkerboard at a magnification of 450× and 1700× respectively of the plate/platesetter/developer system identified as Example 6, exposed at an energy density of 140 $mJ/cm^2$. The dark areas are the unexposed areas (microdots), the light areas are the exposed areas (grainy surface of the aluminium substrate).
Figure 6:
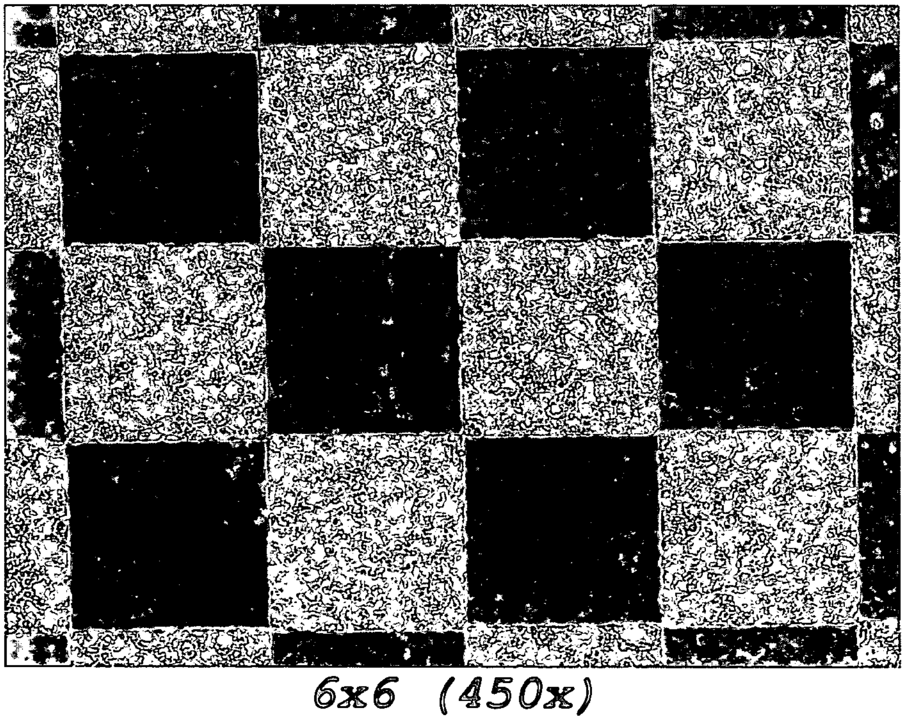

In summary, the present invention enables to expose high-quality halftone images comprising microdots having a size ≦25 μm accurately on a positive-working thermal plate by using an energy density which is in the range from CP to 1.5*CP. The 1×1 (10 μm) checkerboard image shown in FIG. 6 illustrates that for some plates it may be beneficial to use an energy density in the lower part of the range from CP to 1.5*CP: this image has been exposed at 1.4*CP, which is sufficiently low to prevent loss of the complete dot, but it is clear that the physical dot area is less than 50% (the dark unexposed microdots occupy less area than the light non-printing areas where the exposure has rendered the coating soluble in the developer and the grainy surface of the aluminum substrate has been revealed). Exposure according to the preferred embodiment, i.e. at an energy density from CP to 1.3*CP, may therefore produce a physical dot area that is closer to the 50% target value than the exposure in the sub-range from 1.3*CP to 1.5*CP. The energy density may even be in the range from CP to 1.2*CP, from CP to 1.1*CP or be essentially equal to CP.

The halftone image exposed on the plate may also comprise microdots having a size ≦20 μm and even ≦15 μm, e.g. in the range between 10 and 15 μm. The image may contain more than 10%, more preferably more than 20% and most preferably more than 30% of such microdots. In first-order FM screening, the entire image consists of such microdots. The method of the present invention also produces excellent results for the exposure of second-order FM images, as well as images obtained by hybrid screening methods and high-quality AM-screened images, i.e. AM screens having a ruling of not less than 150 lpi (about 60 lines/cm), more preferably not less than 200 lpi (about 80 lines/cm). A preferred example of AM screening is Agfa Balanced Screening, trademark of Agfa-Gevaert, Belgium. Preferred FM screening methods for generating the halftone image are e.g. the commercially available products CrystalRaster, Sublima (both trademarks of Agfa-Gevaert, Belgium) and Staccato (trademark of Creo, Canada). Sublima is a hybrid method generating FM dots in the highlights and shadows of a picture but AM dots in the midtones.

In accordance with the above description, the present invention also provides a method for calibrating a lithographic plate-making system comprising (i) an imagesetter, (ii) a positive-working heat-sensitive lithographic printing plate precursor comprising a support and a coating provided thereon and (iii) a developer, the method comprising the steps of (a) exposing a solid wedge on the printing plate precursor by means of infrared light generated by the imagesetter, wherein the energy density of the infrared light ranges from a minimum value at one end of the wedge to a maximum value at the other end of the wedge;

(b) processing the plate precursor in the developer, thereby removing non-image areas of the coating from the support;

(c) measuring the optical density of the coating at a plurality of areas in the solid wedge;

(d) establishing the clearing point (CP), which is defined as the minimum energy density in the wedge that is required to obtain an optical density of the coating equal to $0.05*D_u$, wherein $D_u$ is the optical density of the coating in the unexposed state; and (e) setting the energy density of the imagesetter to a value in the range from CP to 1.5*CP.

Before turning to the examples section, wherein the methods of the present invention is further illustrated, an overview is given of preferred types of positive-working thermal plates to which the method of the present invention can be applied. It is self-evident that the method of this invention is not restricted to the plates mentioned specifically below but is applicable to any positive-working thermal plate that requires wet processing.

The heat-sensitive lithographic printing plate precursors which are suitable for the method of the present invention typically contain a hydrophilic support and a hydrophobic coating provided thereon comprising an infrared light-to-heat converter such as an infrared dye or pigment and a binder which is soluble in an aqueous alkaline developer.

The support of the lithographic printing plate precursor has a hydrophilic surface or is provided with a hydrophilic layer. The support may be a sheet-like material such as a plate or it may be a cylindrical element such as a sleeve which can be slid around a print cylinder of a printing press. A preferred support is a metal support such as aluminum or stainless steel. The metal can also be laminated to a plastic layer, e.g. polyester film.

A particularly preferred lithographic support is an electrochemically grained and anodized aluminum support. Graining and anodization of aluminum is well known in the art. The anodized aluminum support may be treated to improve the hydrophilic properties of its surface. For example, the aluminum support may be silicated by treating its surface with a sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or may be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulfonic acid, polyvinylbenzenesulfonic acid, sulfuric acid esters of polyvinyl alcohol, and acetals of polyvinyl alcohols formed by reaction with a sulfonated aliphatic aldehyde It is further evident that one or more of these post treatments may be carried out alone or in combination. More detailed descriptions of these treatments are given in GB-A 1 084 070, DE-A 4 423 140, DE-A 4 417 907, EP-A 659 909, EP-A 537 633, DE-A 4 001 466, EP-A 292 801, EP-A 291 760 and U.S. Pat. No. 4,458,005.

The coating, which is provided on the support, may consist of one or more layer(s). Examples of additional layers besides the layer(s) which comprise the alkali-soluble binder or the layer(s) which comprise the infrared light-to-heat converter are e.g. a "subbing" layer which improves the adhesion of the coating to the support and a covering layer which protects the coating against contamination or mechanical damage.

The alkali-soluble binder can be present in one or more layer(s) of the coating. The amount of the binder is advantageously from 40 to 99.8% by weight, preferably from 70 to 99.4% by weight, particularly preferably from 80 to 99% by weight, based in each case on the total weight of the non-volatile components of the coating. The alkali-soluble binder is preferably an organic polymer which has acidic groups with a pKa of less than 13 to ensure that the layer is soluble or at least swellable in aqueous alkaline developers. Advantageously, the binder is a polymer or polycondensate, for example a polyester, polyamide, polyurethane or polyurea. Polycondensates and polymers having free phenolic hydroxyl groups, as obtained, for example, by reacting phenol, resorcinol, a cresol, a xylenol or a trimethylphenol with aldehydes, especially formaldehyde, or ketones are also particularly suitable. Condensates of sulfamoyl- or carbamoyl-substituted aromatics and aldehydes or ketones are also suitable. Polymers of bismethylol-substituted ureas, vinyl ethers, vinyl alcohols, vinyl acetals or vinylamides and polymers of phenylacrylates and copolymers of hydroxy-lphenylmaleimides are likewise suitable. Furthermore, polymers having units of vinylaromatics, N-aryl(meth)acrylamides or aryl (meth)acrylates may be mentioned, it being possible for each of these units also to have one or more carboxyl groups, phenolic hydroxyl groups, sulfamoyl groups or carbamoyl groups. Specific examples include polymers having units of 2-hydroxyphenyl (meth)acrylate, of N-(4-hydroxyphenyl) (meth)acrylamide, of N-(4-sulfamoylphenyl)-(meth)acrylamide, of N-(4-hydroxy-3,5-dimethylbenzyl)-(meth)acrylamide, or 4-hydroxystyrene or of hydroxyphenylmaleimide. The polymers may additionally contain units of other monomers which have no acidic units. Such units include vinylaromatics, methyl (meth)acrylate, phenyl(meth)acrylate, benzyl (meth)acrylate, methacrylamide or acrylonitrile.

In a preferred embodiment, the polycondensate is a phenolic resin, such as a novolac, a resole or a polyvinylphenol. The novolac is preferably a cresol/formaldehyde or a cresol/xylenol/formaldehyde novolac, the amount of novolac advantageously being at least 50% by weight, preferably at least 80% by weight, based in each case on the total weight of all binders.

In a preferred embodiment of the present invention, the alkali-soluble binder is a phenolic resin wherein the phenyl group or the hydroxy group of the phenolic monomeric unit is chemically modified with an organic substituent. The phenolic resins which are chemically modified with an organic substituent may exhibit an increased chemical resistance against printing chemicals such as fountain solutions or press chemicals such as plate cleaners. Examples of preferred chemically modified phenolic resins are described in EP-A 0 934 822, EP-A 0 996 869, EP-A 1 072 432, U.S. Pat. No. 5,641,608, EP-A 0 982 123, WO99/01795, EP-A 933682, EP-A 894622 and WO 99/63407 and in unpublished European patent application nos. 02 102 446, 02 102 444, 02 102 445, 02 102 443, all filed on 15, Oct. 2002 and no. 03 102 522, filed on 13, Aug. 2003.

A specific example of a chemically modified phenolic resin comprises a monomeric unit wherein the phenyl group is substituted with a group having the structure —N=N-Q, wherein the —N=N— group is covalently bound to a carbon atom of the phenyl group and wherein Q is an aromatic group. Most preferred are the polymers wherein Q has the following formula:

(formula I)

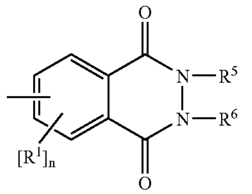

wherein n is 0, 1, 2 or 3, wherein each $R^1$ is selected from hydrogen, an optionally substituted alkyl, alkenyl, alkynyl, cycloalkyl, heterocyclic, aryl, heteroaryl, aralkyl or heteroaralkyl group, $—SO_2—NH—R^2$, $—NH—SO_2—R^4$, $—CO—NR^2—R^3$, $—NR^2—CO—R^4$, $—O—CO—R^4$, $—CO—O—R^2$, $—CO—R^2$, $—SO_3—R^2$, $—SO_2—R^2$, $—SO—R^4$, $—P(=O)(—O—R^2)(—O—R^3)$, $—NR^2—R^3$, $—O—R^2$, $—S—R^2$, —CN, $—NO_2$, a halogen, —N-phthalimidyl, -M-N-phthalimidyl, or $-M-R^2$, wherein M represents a divalent linking group containing 1 to 8 carbon atoms, wherein $R^2$, $R^3$, $R^5$ and $R^6$ are independently selected from hydrogen or an optionally substituted alkyl, alkenyl, alkynyl, cycloalkyl, heterocyclic, aryl, heteroaryl, aralkyl or heteroaralkyl group, wherein $R^4$ is selected from an optionally substituted alkyl, alkenyl, alkynyl, cycloalkyl, heterocyclic, aryl, heteroaryl, aralkyl or heteroaralkyl group, or wherein at least two groups selected from each $R^1$ to $R^4$ together represent the necessary atoms to form a cyclic structure, or wherein $R^5$ and $R^6$ together represent the necessary atoms to form a cyclic structure.

The dissolution behavior of the coating in the developer can be fine-tuned by optional solubility regulating components. More particularly, development accelerators and development inhibitors can be used. These ingredients can be added to the layer(s) which comprise(s) the alkali-soluble binder and/or to (an)other layer(s) of the coating.

Development accelerators are compounds which act as dissolution promoters because they are capable of increasing the dissolution rate of the coating. For example, cyclic acid anhydrides, phenols or organic acids can be used in order to improve the aqueous developability. Examples of the cyclic acid anhydride include phthalic anhydride, tetrahydrophthalic anhydride, hexahydrophthalic anhydride, 3,6-endoxy-4-tetrahydro-phthalic anhydride, tetrachlorophthalic anhydride, maleic anhydride, chloromaleic anhydride, alpha-phenylmaleic anhydride, succinic anhydride, and pyromellitic anhydride, as described in U.S. Pat. No. 4,115,128. Examples of the phenols include bisphenol A, p-nitrophenol, p-ethoxyphenol, 2,4,4'-trihydroxybenzophenone, 2,3,4-trihydroxy-benzophenone, 4-hydroxybenzophenone, 4,4',4"-trihydroxy-triphenylmethane, and 4,4',3",4"-tetrahydroxy-3,5,3',5'-tetramethyltriphenyl-methane, and the like. Examples of the organic acids include sulfonic acids, sulfinic acids, alkylsulfuric acids, phosphonic acids, phosphates, and carboxylic acids, as described in, for example, JP-A Nos. 60-88,942 and 2-96,755. Specific examples of is these organic acids include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, 3,4,5-trimethoxybenzoic acid, 3,4,5-trimethoxycinnamic acid, phthalic acid, terephthalic acid, 4-cyclohexene-1,2-dicarboxylic acid, erucic acid, lauric acid, n-undecanoic acid, and ascorbic acid. The amount of the cyclic acid anhydride, phenol, or organic acid contained in the coating is preferably in the range of 0.05 to 20% by weight.

In a preferred embodiment, the coating also contains developer resistance means, also called development inhibitors, i.e. one or more ingredients which are capable of delaying the dissolution of the unexposed areas during processing. The dissolution inhibiting effect is preferably reversed by heating, so that the dissolution of the exposed areas is not substantially delayed and a large dissolution differential between exposed and unexposed areas can thereby be obtained. Such developer resistance means can be added to a layer comprising the alkali-soluble binder or to another layer of the coating.

The compounds described in e.g. EP-A 823 327 and WO97/39894 are believed to act as dissolution inhibitors due to interaction, e.g. by hydrogen bridge formation, with the alkali-soluble binder(s) in the coating. Inhibitors of this type typically comprise at least one hydrogen bridge forming group such as nitrogen atoms, onium groups, carbonyl (—CO—), sulfinyl (—SO—) or sulfonyl (—$SO_2$—) groups and a large hydrophobic moiety such as one or more aromatic nuclei.

Other suitable inhibitors improve the developer resistance because they delay the penetration of the aqueous alkaline developer into the coating. Such compounds can be present in the layer(s) comprising the alkali-soluble binder, as described in e.g. EP-A 950 518, and/or in a development barrier layer on top of said layer, as described in e.g. EP-A 864 420, EP-A 950 517, WO 99/21725 and WO 01/45958. In the latter embodiment, the solubility of the barrier layer in the developer or the penetrability of the barrier layer by the developer can be increased by exposure to heat or infrared light.

Preferred examples of inhibitors which delay the penetration of the aqueous alkaline developer into the coating include the following:

(a) A polymeric material which is insoluble in or impenetrable by the developer, e.g. a hydrophobic or water-repellent polymer or copolymer such as acrylic polymers, polystyrene, styrene-acrylic copolymers, polyesters, polyamides, polyureas, polyurethanes, nitrocellulosics and epoxy resins; or polymers comprising siloxane (silicones) and/or perfluoroalkyl units.

(b) Bifunctional compounds such as surfactants comprising a polar group and a hydrophobic group such as a long chain hydrocarbon group, a poly- or oligosiloxane and/or a perfluorinated hydrocarbon group. A typical example is Megafac F-177, a perfluorinated surfactant available from Dainippon Ink & Chemicals, Inc. A suitable amount of such compounds is between 10 and 100 mg/m$^2$, more preferably between 50 and 90 mg/m$^2$.

(c) Bifunctional block-copolymers comprising a polar block such as a poly- or oligo(alkylene oxide) and a hydrophobic block such as a long chain hydrocarbon group, a poly- or oligosiloxane and/or a perfluorinated hydrocarbon group. A suitable amount of such compounds is between 0.5 and 25 mg/m$^2$, preferably between 0.5 and 15 mg/m$^2$ and most preferably between 0.5 and 10 mg/m$^2$. A suitable copolymer comprises about 15 to 25 siloxane units and 50 to 70 alkyleneoxide groups. Preferred examples include copolymers comprising phenylmethylsiloxane and/or dimethylsiloxane as well as ethylene oxide and/or propylene oxide, such as Tego Glide 410, Tego Wet 265, Tego Protect 5001 or Silikophen P50/X, all commercially available from Tego Chemie, Essen, Germany. Said poly- or oligosiloxane may be a linear, cyclic or complex cross-linked polymer or copolymer. The term polysiloxane compound shall include any compound which contains more than one siloxane group —Si(R,R')—O—, wherein R and R' are optionally substituted alkyl or aryl groups. Preferred siloxanes are phenylalkylsiloxanes and dialkylsiloxanes. The number of siloxane groups in the polymer or oligomer is at least 2, preferably at least 10, more preferably at least 20. It may be less than 100, preferably less than 60.

It is believed that during coating and drying, the above mentioned inhibitor of type (b) and (c) tends to position itself, due to its bifunctional structure, at the interface between the coating and air and thereby forms a separate top layer even when applied as an ingredient of the coating solution of the layer comprising the alkali-soluble binder. Simultaneously, the surfactants also act as a spreading agent which improves the coating quality. The separate top layer thus formed seems to be capable of acting as the above mentioned barrier layer which delays the penetration of the developer into the coating.

Alternatively, the inhibitor of type (a) to (c) can be applied in a separate solution, coated on top of the layer(s) comprising the alkali-soluble binder. In that embodiment, it may be advantageous to use a solvent in the second coating solution that is not capable of dissolving the ingredients present in the first layer so that a highly concentrated water-repellent or hydrophobic phase is obtained at the top of the coating which is capable of acting as the above mentioned development barrier layer.

The infrared light absorbing dye or pigment may be present in the same layer(s) as the alkali-soluble binder, in the optional barrier layer discussed above and/or in an optional other layer. According to a highly preferred embodiment, the IR absorber is concentrated in or near the barrier layer, e.g. in an intermediate layer between the alkali-soluble binder and the barrier layer. According to that embodiment, said intermediate layer comprises the IR absorbing compound in an amount higher than the amount of IR absorbing compound in the alkali-soluble binder or in the barrier layer. Preferred IR absorbing dyes are cyanine dyes, merocyanine dyes, indoaniline dyes, oxonol dyes, pyrilium dyes and squarilium dyes. Examples of suitable IR dyes are described in e.g. EP-As 823327, 978376, 1029667, 1053868, 1093934; WO 97/39894 and 00/29214. A preferred compound is the following cyanine dye:

IR-1

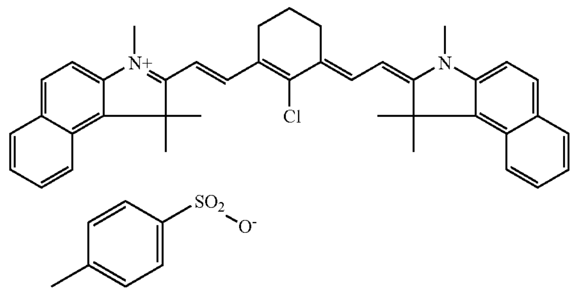

The preferred amount of this dye is less than 40 mg/$m^2$.

To protect the surface of the coating, in particular from mechanical damage, a protective layer may also optionally be applied. The protective layer generally comprises at least one water-soluble binder, such as polyvinyl alcohol, polyvinylpyrrolidone, partially hydrolyzed polyvinyl acetates, gelatin, carbohydrates or hydroxyethylcellulose, and can be produced in any known manner such as from an aqueous solution or dispersion which may, if required, contain small amounts, i.e. less than 5% by weight, based on the total weight of the coating solvents for the protective layer, of organic solvents. The thickness of the protective layer can suitably be any amount, advantageously up to 5.0 μm, preferably from 0.1 to 3.0 μm, particularly preferably from 0.15 to 1.0 μm.

Optionally, the coating and more specifically the layer(s) comprising the alkali-soluble binder may further contain additional ingredients.

Colorants can be added such as dyes or pigments which provide a visible color to the coating and which remain in the coating at unexposed areas so that a visible image is produced after exposure and processing. Typical examples of such contrast dyes are the amino-substituted tri- or diarylmethane dyes, e.g. crystal violet, methyl violet, victoria pure blue, flexoblau 630, basonylblau 640, auramine and malachite green. Also the dyes which are discussed in depth in the detailed description of EP-A 400706 are suitable contrast dyes.

Surfactants, especially perfluoro surfactants, silicon or titanium dioxide particles, polymers particles such as matting agents and spacers are also well-known components of lithographic coatings.

For the preparation of the lithographic plate precursor, any known method can be used. For example, the above ingredients can be dissolved in a solvent mixture which does not react irreversibly with the ingredients and which is preferably tailored to the intended coating method, the layer thickness, the composition of the layer and the drying conditions. Suitable solvents include ketones, such as methyl ethyl ketone (butanone), as well as chlorinated hydrocarbons, such as trichloroethylene or 1,1,1-trichloroethane, alcohols, such as methanol, ethanol or propanol, ethers, such as tetrahydrofuran, glycol-monoalkyl ethers, such as ethylene glycol monoalkyl ether, e.g. 2-methoxy-1-propanol, or propylene glycol monoalkyl ether and esters, such as butyl acetate or propylene glycol monoalkyl ether acetate. It is also possible to use a mixture which, for special purposes, may additionally contain solvents such as acetonitrile, dioxane, dimethylacetamide, dimethylsulfoxide or water.

Any coating method can be used for applying one or more coating solutions to the hydrophilic surface of the support. A multi-layer coating can be applied by coating/drying each layer consecutively or by the simultaneous coating of several coating solutions at once. In the drying step, the volatile solvents are removed from the coating until the coating is self-supporting and dry to the touch. However it is not necessary (and may not even be possible) to remove all the solvent in the drying step. Indeed the residual solvent content may be regarded as an additional composition variable by means of which the composition may be optimised. Drying is typically carried out by blowing hot air onto the coating, typically at a temperature of at least 70° C., suitably 80-150° C. and especially 90-140° C. Also infrared lamps can be used. The drying time may typically be 15-600 seconds.

Between coating and drying, or after the drying step, a heat treatment and subsequent cooling may provide additional benefits, as described in WO99/21715, EP-A 1074386, EP-A 1074889, WO00/29214, and unpublished Eur. patent application nos. 02102413, 02102414, 02102415, filed on 4, Oct. 2002.

The plate precursor can be image-wise exposed directly with heat, e.g. by means of a thermal head, or indirectly by infrared light, preferably near infrared light. The infrared light is preferably converted into heat by an IR light absorbing compound as discussed above. The heat-sensitive lithographic printing plate precursor is preferably not sensitive to visible light, i.e. no substantial effect on the dissolution rate of the coating in the developer is induced by exposure to visible light. Most preferably, the coating is not sensitive to ambient daylight, i.e. visible (400-750 nm) and near UV light (300-400 nm) at an intensity and exposure time corresponding to normal working conditions so that the plate precursor can be handled without the need for a safe light environment. "Not sensitive" to daylight shall mean that no substantial change of the dissolution rate of the coating in the developer is induced by exposure to ambient daylight. In a preferred daylight stable embodiment, the coating does not comprise photosensitive ingredients, such as (quinone)diazide or diazo(nium) compounds, photoacids, photoinitiators, sensitizers etc., which absorb the near UV and/or visible light that is present in sun light or office lighting and thereby change the solubility of the coating in exposed areas.

The printing plate precursor can be exposed to infrared light by means of e.g. LEDs or a laser. Most preferably, the light used for the exposure is a laser emitting near infrared light having a wavelength in the range from about 750 to about 1500 nm, more preferably 750 to 1100 nm, such as a semiconductor laser diode, a Nd:YAG or a Nd:YLF laser. The required laser power depends on the sensitivity of the plate precursor, the pixel dwell time of the laser beam, which is determined by the spot diameter (typical value of modern plate-setters at 1/$e^2$ of maximum intensity: 5-25 μm), the scan speed and the resolution of the exposure apparatus (i.e. the number of addressable pixels per unit of linear distance, often expressed in dots per inch or dpi; typical value: 1000-4000 dpi).

Two types of laser-exposure apparatuses are commonly used: internal (ITD) and external drum (XTD) platesetters. ITD plate-setters for thermal plates are typically characterized by a very high scan speed up to 500 m/sec and may require a laser power of several Watts. XTD plate-setters for thermal plates having a typical laser power from about 200 mW to about 1 W operate at a lower scan speed, e.g. from 0.1 to 10 m/sec. An XTD platesetter equipped with one or more laserdiodes emitting in the wavelength range between 750 and 850 nm is an especially preferred embodiment for the method of the present invention.

The known plate-setters can be used as an off-press exposure apparatus, which offers the benefit of reduced press down-time. XTD plate-setter configurations can also be used for on-press exposure, offering the benefit of immediate registration in a multi-color press. More technical details of on-press exposure apparatuses are described in e.g. U.S. Pat. Nos. 5,174,205 and 5,163,368.

The formation of the lithographic image by the plate precursor is due to a heat-induced solubility differential of the coating during processing in the developer. The solubility differentiation between image (printing, oleophilic) and non-image (non-printing, hydrophilic) areas of the lithographic image is believed to be a kinetic rather than a thermodynamic effect, i.e. the non-image areas are characterized by a faster dissolution in the developer than the image-areas. As a result of said dissolution, the underlying hydrophilic surface of the support is revealed at the non-image areas. In a most preferred embodiment, the non-image areas of the coating dissolve completely in the developer before the image areas are attacked so that the latter are characterized by sharp edges and high ink-acceptance. The time difference between completion of the dissolution of the non-image areas and the onset of the dissolution of the image areas is preferably longer than 10 seconds, more preferably longer than 20 seconds and most preferably longer than 60 seconds, thereby offering a wide development latitude.

In the processing step, the non-image areas of the coating are removed by immersion in a conventional aqueous alkaline developer, which may be combined with mechanical rubbing, e.g. by a rotating brush. During development, any water-soluble protective layer present is also removed. Silicate-based developers which have a ratio of silicon dioxide to alkali metal oxide of at least 1 are preferred to ensure that the alumina layer (if present) of the substrate is not damaged. Preferred alkali metal oxides include $Na_2O$ and $K_2O$, and mixtures thereof. In addition to alkali metal silicates, the developer may optionally contain further components, such as buffer substances, complexing agents, antifoams, organic solvents in small amounts, corrosion inhibitors, dyes, surfactants and/or hydrotropic agents as well known in the art. The developer may further contain compounds which increase the developer resistance of the non-image areas, e.g. a polyalcohol such as sorbitol, preferably in a concentration of at least 40 g/l, and/or a poly(alkylene oxide) containing compound such as e.g. Supronic B25, commercially available from RODIA, preferably in a concentration of at most 0.15 g/l.

The development is preferably carried out at temperatures of from 20 to 40° C. in automated processing units as customary in the art. For regeneration, alkali metal silicate solutions having alkali metal contents of from 0.6 to 2.0 mol/l can suitably be used. These solutions may have the same silica/alkali metal oxide ratio as the developer (generally, however, it is lower) and likewise optionally contain further additives. The required amounts of regenerated material must be tailored to the developing apparatuses used, daily plate throughputs, image areas, etc. and are in general from 1 to 50 ml per square meter of plate precursor. The addition can be regulated, for example, by measuring the conductivity as described in EP-A 0 556 690. The processing of the plate precursor may also comprise a rinsing step, a drying step and/or a gumming step. The plate precursor can, if required, be post-treated with a suitable correcting agent or preservative as known in the art. To increase the resistance of the finished printing plate and hence to extend the run length, the layer can be briefly heated to elevated temperatures ("baking").

The printing plate thus obtained can be used for conventional, so-called wet offset printing, in which ink and an aqueous dampening liquid is supplied to the plate. Another suitable printing method uses so-called single-fluid ink without a dampening liquid. Suitable single-fluid inks have been described in U.S. Pat. Nos. 4,045,232; 4,981,517 and 6,140,392. In a most preferred embodiment, the single-fluid ink comprises an ink phase, also called the hydrophobic or oleophilic phase, and a polyol phase as described in WO 00/32705.

The oleophilic coating described herein can also be used as a thermo-resist for forming a pattern on a substrate by direct imaging techniques, e.g. in a PCB (printed circuit board) application as described in US 2003/0003406 A1.

EXAMPLES

Materials

Six systems consisting of a positive-working thermal plate, an aqueous alkaline developer and an infrared platesetter were evaluated:

Ex.1: Thermostar P970 plate and EP26 developer (22° C., 19 s), both trademarks of Agfa-Gevaert N. V. Belgium; exposed with a Trendsetter TE318, trademark of Creo, Canada.

Ex.2: Electra Excel plate and Goldstar developer (23° C., 38 s), both trademarks of Kodak Polychrome Graphics, USA; exposed with an Xcalibur 45, trademark of Agfa-Gevaert N. V., Belgium.

Ex.3: Diamond LT2 plate and EDR-K developer (28° C., 26 s), both trademarks of Western Litotech, USA; exposed with an Xcalibur 45, trademark of Agfa-Gevaert N. V., Belgium.

Ex.4: Brillia PSE plate and LHDS developer (29° C., 25 s), both trademarks of Fuji Photo Film, Japan; exposed with an Xcalibur 45, trademark of Agfa-Gevaert N.V., Belgium.

Ex.5: plate material P1 and developer D1 (25° C., 22 s), prepared as described below; exposed with a Trendsetter TE318, trademark of Creo, Canada.

Ex.6: plate material P2 and developer D2 (25° C., 22 s), prepared as described below; exposed with a Trendsetter TE318, trademark of Creo, Canada.

Both the Trendsetter TE318 and the Xcalibur 45 are platesetters with a semiconductor laser source emitting in the 810-830 nm range and having a spot size of 10.6 μm, i.e. a 1×1 checkerboard pattern produces a dot of about 10 μm, a 2×2 checkerboard pattern produces a dot of about 20 μm, etc. The pixel dwell time was 1.2 μs (Trendsetter; drum speed 140 rpm) and 3.6 μs (Xcalibur; drum speed 190 rpm) respectively. All processing was done in an Autolith T processor, trademark of Agfa-Gevaert N.V., Belgium.

Plate Material P1

The following coating solution was prepared:

| | Parts (grams) |
|---|---|
| Dowanol PM (1) | 389.06 |
| Methyl ethyl ketone | 262.20 |
| Tetrahydrofuran | 206.40 |
| Alnovol SPN452 (2) | 132.50 |
| 3,4,5-trimethoxy cinnamic acid | 7.29 |

-continued

| | Parts (grams) |
|---|---|
| S0094 (3) | 1.50 |
| Basonylblau 640 | 0.54 |
| TegoGlide 410 | 0.52 |

(1) 1-methoxy-2-propanol from Dow Chemical Company.
(2) Alnovol SPN452 is a 40.4 wt. % solution of novolac in Dowanol PM (commercially available from Clariant).
(3) S0094 is an IR absorbing cyanine dye commercially available from FEW Chemicals. S0094 has the chemical structure IR-1 shown above.
(4) Basonyl Blue 640 is a quaternized triarylmethane dye commercially available from BASF.
(5) TegoGlide 410 is a 10 wt. % dispersion in water of a block-co-polysiloxane/poly(alkylene oxide) surfactant commercially available from Tego Chemie Service GmbH.

Plate Material P2

| INGREDIENTS | Parts (grams) |
|---|---|
| Dowanol PM (defined above) | 330.04 |
| Methyl ethyl ketone | 267.99 |
| Tetrahydrofuran | 210.16 |
| 20 wt. % solution of POL-01 (1) in Dowanol PM | 158.03 |
| DURITE SD126A (2) | 10.54 |
| S0094 (defined above) | 1.52 |
| TegoGlide 410 (defined above) diluted 1:10 with Dowanol PM | 21.72 |

(1) POL-01 is a chemically modified novolac, prepared as follows:

Preparation of the diazonium solution:

A mixture of 2.6 g AM-10 and 25 ml acetic acid and 37.5 ml water was cooled to 15° C. Then 2.5 ml concentrated HCl was added and the mixture was further cooled to 0° C. Then, a solution of 1.1 g $NaNO_2$ in 3 ml water was added dropwise after which stirring was continued for another 30 minutes at 0° C. AM-10 is a compound having the following chemical structure:

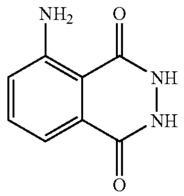

Preparation of the phenolic polymer solution:

A mixture of 45.9 g ALNOVOL SPN452 (Alnovol SPN452 is a solution of a novolac resin, 40 % by weight in Dowanol PM, obtained from Clariant GmbH), 16.3 g $NaOAc.3H_2O$ and 200 ml 1-methoxy-2-propanol was stirred and cooled to 10° C.

The above prepared diazonium solution was added dropwise to the phenolic polymer solution over a 30 minute period after which stirring was continued for 120 minutes at 15° C. The resulting mixture was then added to 2 liters ice-water over a 30 minute period while continuously stirring. The polymer was precipitated from the aqueous medium and was isolated by filtration. The desired product was finally obtained by washing with water and subsequent drying at 45° C.

(2) meta-cresol novolac resin obtained from BORDEN CHEM. INC. ($M_n/M_w$ is 700/1700)

The above solutions were coated on a conventional grained and anodized aluminium support at a wet coating thickness of 26 μm and dried. The dry coating weight was 1.47 g/m$^2$. After cutting and packing, the plates were aged in a warehouse during 5 days at 50° C.

Developer D1

The following solution was prepared:

| | Parts |
|---|---|
| water | 940.0 ml |
| 40 wt. % aqueous solution of $Na_3$-EDTA-OH (1) | 0.6 ml |
| sodium metasilicate (5 aqua) | 100.0 g |
| 40 wt. % aqueous solution of sodium silicate (2) | 10.0 ml |
| aqueous surfactant solution comprising | 5.0 ml |
| 5 g/l of Triton H-66 (3) | |
| 50 mg/l of Variquat CC9NS (4) | |
| 160 mg/l of Synperonic 304 (5) | |

(1) ethylene diamine tetra-acetate tri-sodium salt
(2) molar ratio of $SiO_2/Na_2O$ = 3.2
(3) an alkylarylalkoxyethylester of potassium phosphate from Union Carbide
(4) a polypropylene (n = 4-10)-ethyl-diethyl-methyl ammonium chloride from Degussa Benelux
(5) a polycondensate of alkyleneoxides and ethylene diamine from Uniqema Developer D2

The following solution was prepared:

| | Parts |
|---|---|
| water | 870.0 ml |
| sodium metasilicate (5 aqua) | 108.0 g |
| Supronic B25 (1) | 135.0 mg |
| 70 wt. % aqueous solution of sorbitol | 41.7 ml |

(1) anionic poly(alkylene oxide) surfactant from Rhodia.

Methods

The optical REED and physical REED values of the above systems was determined as explained above by exposing nxn checkerboard patterns at various energy densities and establishing at which energy density the dot coverage, obtained from 'marcroscopic' and 'microscopic' densitometry and the Murray-Davies equation defined above, was equal to 50%.

The 'macroscopic' reflection density was obtained with a GretagMacbeth D19C 47B/P densitometer, commercially available from Gretag-Macbeth AG. Such conventional densitometers are typically equipped with several filters (e.g. cyan, magenta, yellow): the optical density was measured with the filter that corresponds to the color of the coating, e.g. a cyan filter is preferably used for measuring the optical density of a blue colored coating. All optical density values were measured with reference to the uncoated support of the plate.

Physical REED values were obtained by microdensitometry, more particularly by means of a microimage digitizer and analysis system which was assembled by the following commercially available components:

an optical microscope type Ergopla, trade name of Leitz, is which was used in reflection mode and equiped with a 20× lens.

a monochrome digital camera type CH250 from Photometrics, equipped with a 1024×1024 pixel CCD and a 16 bit analogue-to-digital converter.

- a personal computer provided with a standard frame grabber card.
- an A4-size XY table type MCL, from Maerzhauser.
- image analysis software ImageProPlus, version 4.5 from Media Cybernetics.

The digital camera records the image produced by the microscope and the output of the camera is captured by the frame grabber card and is then available for analysis by the image analysis software. The resolution of the above system was 0.47×0.47 μm per pixel. The software is capable of distinguishing the microdots (printing areas) from the background areas (non-printing aluminum support) and calculates the area occupied by these microdots as a percentage of the total area.

The clearing point was obtained by exposing a step wedge with fixed intervals of 10 $mJ/cm^2$ on the plates with the above defined exposure devices and using the above defined GretagMacbeth densitometer for measuring the optical density in each step of the exposed coating after processing. All plates provided clear prints without toning (i.e. no ink acceptance in the exposed areas) at the clearing point, i.e. exposed with the energy density that reduces the optical density of the coating to $0.05*D_u$.

Results

Table 1 lists the optical dot area values of the six systems, exposed with a 1×1, 2×2 and 6×6 checkerboard pattern at various densities.

TABLE 1

| Example 1 | | | | Example 2 | | | | Example 3 | | | |
|---|---|---|---|---|---|---|---|---|---|---|---|
| Energy density | Optical dot area | | | Energy density | Optical dot area | | | Energy density | Optical dot area | | |
| ($mJ/cm^2$) | 1 × 1 | 2 × 2 | 6 × 6 | ($mJ/cm^2$) | 1 × 1 | 2 × 2 | 6 × 6 | ($mJ/cm^2$) | 1 × 1 | 2 × 2 | 6 × 6 |
| 60 | 80 | 71 | 61 | 85 | 95 | 90 | | 76 | 93 | 83 | 69 |
| 80 | 70 | 63 | 56 | 95 | 93 | 87 | 59.5 | 85 | 89 | 77 | 64 |
| 100 | 65 | 61 | 55 | 105 | 90 | 81 | 58.5 | 95 | 83 | 72 | 61 |
| 120 | 59 | 58 | 54 | 114 | 86 | 77 | 55.5 | 105 | 77 | 68 | 60 |
| 140 | 55 | 56 | 54 | 124 | 83 | 74 | 54.5 | 114 | 69 | 64 | 57 |
| 160 | 51 | 54 | 53 | 133 | 77 | 69 | 53.5 | 133 | 52 | 57 | 55 |
| 180 | 47 | 52 | 52 | 143 | 73 | 67 | 53.0 | 143 | 46 | 54 | 53 |
| 200 | 44 | 51 | 52 | 153 | 68 | 65 | 51.5 | 153 | 41 | 52 | 53 |
| | | | | 162 | 64 | 63 | 50.5 | 162 | 38 | 51 | 53 |
| | | | | 172 | 58 | 61 | 50.0 | 172 | 34 | 48 | 51 |
| **Example 4** | | | | **Example 5** | | | | **Example 6** | | | |
| Energy density | Optical dot area | | | Energy density | Optical dot area | | | Energy density | Optical dot area | | |
| ($mJ/cm^2$) | 1 × 1 | 2 × 2 | 6 × 6 | ($mJ/cm^2$) | 1 × 1 | 2 × 2 | 6 × 6 | ($mJ/cm^2$) | 1 × 1 | 2 × 2 | 6 × 6 |
| 95 | 94 | 85 | 65 | 60 | 95 | 89 | 78 | 60 | 91 | 86 | 79 |
| 105 | 92 | 78 | 60 | 80 | 80 | 66 | 57 | 90 | 85 | 76 | 67 |
| 114 | 86 | 72 | 58 | 100 | 69 | 61 | 54 | 120 | 77 | 69 | 59 |
| 124 | 80 | 67 | 56 | 120 | 58 | 57 | 53 | 150 | 72 | 66 | 58 |
| 133 | 74 | 64 | 56 | 140 | 50 | 55 | 53 | 180 | 68 | 62 | 56 |
| 143 | 66 | 61 | 55 | 160 | 46 | 53 | 52 | 210 | 62 | 60 | 55 |
| 153 | 59 | 58 | 54 | 180 | 41 | 50 | 52 | 240 | 57 | 57 | 54 |
| 162 | 53 | 56 | 53 | 200 | 38 | 49 | 51 | 270 | 52 | 55 | 53 |
| 172 | 53 | 55 | 53 | 220 | 34 | 48 | 51 | 300 | 47 | 53 | 52 |

Table 2 lists the physical dot area values of the six systems, exposed with a 1×1, 2×2 and 6×6 checkerboard pattern at various densities.

TABLE 2

| Example 1 | | | | Example 2 | | | | Example 3 | | | |
|---|---|---|---|---|---|---|---|---|---|---|---|
| Energy density | Physical dot area | | | Energy density | Physical dot area | | | Energy density | Physical dot area | | |
| ($mJ/cm^2$) | 1 × 1 | 2 × 2 | 6 × 6 | ($mJ/cm^2$) | 1 × 1 | 2 × 2 | 6 × 6 | ($mJ/cm^2$) | 1 × 1 | 2 × 2 | 6 × 6 |
| 60 | 51.0 | 57.0 | 52.0 | 105 | | | 56.0 | 76 | 70.0 | 66.0 | 56.0 |
| 80 | 53.0 | 51.0 | 49.5 | 114 | | | 53.5 | 85 | 61.0 | 56.0 | 51.0 |
| 100 | 47.5 | 46.5 | 49.0 | 124 | | 58.0 | 53.0 | 95 | 54.5 | 52.0 | 50.0 |
| 120 | 40.5 | 40.5 | 48.0 | 133 | | 52.0 | 52.0 | 105 | 48.5 | 48.0 | 48.5 |
| 140 | 37.5 | 37.5 | 47.5 | 143 | | 50.0 | 50.5 | 114 | 40.0 | 43.0 | 47.0 |
| | | | | 153 | | 47.5 | 49.5 | | | | |
| | | | | 162 | | 46.5 | 49.5 | | | | |

TABLE 2-continued

| Example 4 | | | | Example 5 | | | | Example 6 | | | |
|---|---|---|---|---|---|---|---|---|---|---|---|
| Energy density | Physical dot area | | | Energy density | Physical dot area | | | Energy density | Physical dot area | | |
| ($mJ/cm^2$) | 1 × 1 | 2 × 2 | 6 × 6 | ($mJ/cm^2$) | 1 × 1 | 2 × 2 | 6 × 6 | ($mJ/cm^2$) | 1 × 1 | 2 × 2 | 6 × 6 |
| 105 | | 64.0 | 55.5 | 80 | 59.0 | 53.5 | 51.0 | 80 | 59.5 | 56.0 | 51.5 |
| 114 | | 62.0 | 54.0 | 100 | 47.5 | 47.0 | 49.0 | 100 | 52.5 | 52.0 | 51.0 |
| 124 | | 56.5 | 53.0 | 120 | 38.0 | 43.0 | 47.5 | 120 | 48.5 | 49.5 | 50.0 |
| 133 | | 55.0 | 51.0 | 140 | 30.0 | 40.0 | 47.0 | 140 | 42.0 | 47.5 | 49.5 |
| 143 | | 48.5 | 50.0 | | | | | 160 | 41.0 | 45.0 | 49.0 |
| 153 | | 48.0 | 48.5 | | | | | 180 | 34.0 | 42.5 | 48.5 |

For each series of dot area values vs. energy density values, a graph with a trendline was made, as shown in FIGS. 3 and 4 for Example 6. By interpolation, the energy density was determined at which the dot area equals 50%, so as to obtain the optical REED values from the data in Table 1 and the physical REED values from the data in Table 2. The physical REED values are represented in Table 3, which also provides the clearing points (CP) of each system as well as the ratio of the physical REED values and the clearing point.

TABLE 3

| | | 1 × 1 checkerboard (10 μm dot) | | 2 × 2 checkerboard (20 μm dot) | |
|---|---|---|---|---|---|
| Ex. | CP ($mJ/cm^2$) | Phys.REED ($mJ/cm^2$) | Phys.REED / CP | Phys.REED ($mJ/cm^2$) | Phys.REED / CP |
| 1 | 60 | 90 | 1.50 | 85 | 1.42 |
| 2 | 95 | | | 140 | 1.47 |
| 3 | 100 | 103 | 1.03 | 100 | 1.00 |
| 4 | 95 | | | 140 | 1.47 |
| 5 | 80 | 95 | 1.19 | 90 | 1.13 |
| 6 | 100 | 115 | 1.15 | 115 | 1.15 |

It is clear from Table 3 that the values of the ratio Phys. REED/CP are smaller than 1.5 which illustrates the method of the present invention that accurate reproduction of small dots can be obtained by exposing the dots with light having an energy density within the range from CP to 1.5*CP.

We claim:

1. A method for making a lithographic printing plate comprising the steps of (a) providing a heat-sensitive positive-working lithographic printing plate precursor which comprises a support and a coating thereon, wherein the coating comprises a novolac, a resole, or a polyvinylphenol;

(b) exposing a halftone image comprising microdots having a size of 25 μm or less on the plate precursor by means of infrared light; and (c) processing the plate precursor in a developer, thereby removing non-image areas of the coating from the support;

wherein the infrared light has an energy density in the range from CP to 1.5*CP, wherein CP is the clearing point which is defined as the minimum energy density that is required to obtain, after the processing step, an optical density of the coating at fully exposed areas equal to $0.05*D_u$, and wherein $D_u$ is the optical density of the coating in the unexposed state.

2. The method according to claim 1 wherein the microdots having a size of 25 μm or less represent at least 10% of the halftone image.

3. The method according to claim 1 wherein the halftone image is obtained by means of a first-order stochastic screening method.

4. The method according to claim 1 wherein the halftone image is obtained by means of a second-order stochastic screening method.

5. The method according to claim 1 wherein the halftone image is obtained by means of an amplitude-modulated screening method at a ruling of not less than 150 lpi.

6. The method according to claim 1 wherein the halftone image is obtained by means of an amplitude-modulated screening method at a ruling of not less than 200 lpi.

7. The method according to claim 1 wherein the halftone image is obtained by a hybrid screening method, wherein some portions of the image comprises microdots having a size of 25 μm or less provided by first-order or second-order stochastic screening and other portions of the image are provided by amplitude-modulated screening.

8. The method according to claim 1 wherein the microdots have a size of 20 μm or less.

9. The method according to claim 1 wherein the microdots have a size of 15 μm or less.

10. The method according to claim 1 wherein the microdots have a size between 10 and 15 μm.

11. The method according to claim 1 wherein the microdots have a square form.

12. The method according to claim 1 wherein the infrared light has an energy density in the range from CP to 1.3*CP.

13. The method according to claim 1 wherein the infrared light has an energy density in the range from CP to 1.2*CP.

14. The method according to claim 1 wherein the infrared light has an energy density in the range from CP to 1.1*CP.

15. The method according to claim 1 wherein the infrared light has an energy density which is essentially equal to CP.

16. The method according to claim 1 wherein the microdots have a size between 10 and 15 μm and wherein the infrared light has an energy density in the range from CP to 1.3*CP.

17. The method according to claim 1 wherein the infrared light is laser light having a wavelength in the range from 750 to 850 nm.

18. A method of lithographic printing comprising (a) providing a lithographic plate by a method comprising the steps of (i) providing a heat-sensitive positive-working lithographic printing plate precursor which comprises a support and a coating thereon, wherein the coating comprises a novolac, a resole, or a polyvinylphenol;

(ii) exposing a halftone image comprising microdots having a size of 25 μm or less on the plate precursor by means of infrared light; and (iii) processing the plate precursor in a developer, thereby removing non-image areas of the coating from the support;

wherein the infrared light has an energy density in the range from CP to 1.5*CP, wherein CP is the clearing point which is defined as the minimum energy density that is required to obtain, after the processing step, an optical density of the coating at fully exposed areas equal to 0.05*$D_u$, and wherein $D_u$ is the optical density of the coating in the unexposed state, (b) mounting the lithographic printing plate prepared in step (a) on a lithographic printing press, (c) supplying ink to said plate, and (d) image-wise transferring the ink from said plate to paper.

19. The method according to claim 18 wherein the micro-dots have a size between 10 and 15 μm and wherein the infrared light has an energy density in the range from CP to 1.3*CP.

* * * * *